United States Patent
Kim et al.

(10) Patent No.: US 7,808,319 B2
(45) Date of Patent: Oct. 5, 2010

(54) DIFFERENTIAL AMPLIFIER CIRCUIT AND FREQUENCY MIXER FOR IMPROVING LINEARITY

(75) Inventors: Byung Sung Kim, Suwon-si (KR); Tae Sung Kim, Seoul (KR)

(73) Assignee: Sungkyunkwan University Foundation for Corporate Collaboration, Cheoncheon-dong, Jangan-gu, Suwon-si, Gyeonggi-do (KR)

( * ) Notice: Subject to any disclaimer, the term of this patent is extended or adjusted under 35 U.S.C. 154(b) by 72 days.

(21) Appl. No.: 12/325,400

(22) Filed: Dec. 1, 2008

(65) Prior Publication Data

US 2009/0219094 A1    Sep. 3, 2009

(30) Foreign Application Priority Data

Feb. 29, 2008    (KR) ................. 10-2008-0018776

(51) Int. Cl.
H03F 3/45    (2006.01)
(52) U.S. Cl. .................................... 330/253
(58) Field of Classification Search .............. 330/253; 327/359, 563
See application file for complete search history.

(56) References Cited

U.S. PATENT DOCUMENTS 7,633,341 B2 * 12/2009 Bagheri et al. ............. 330/253

FOREIGN PATENT DOCUMENTS

KR    10-2005-0064114    6/2005

* cited by examiner

*Primary Examiner*—Khanh V Nguyen
(74) *Attorney, Agent, or Firm*—Lexyoume IP Group, PLLC.

(57) ABSTRACT

A differential amplifier circuit and a frequency mixer for improving linearity are disclosed. The disclosed differential amplifier circuit includes first and second loads, a first output terminal for the first load, a second output terminal for the second load, a differential amplifying stage including a differential stage for amplifying a voltage difference between a first input stage and a second input stage, and a biasing current source for biasing the differential stage, and a non-linearity filtering circuit for filtering a non-linear signal generated from the differential amplifying stage. The non-linearity filtering circuit includes a first cross circuit including a first transistor to connect the first and second output terminals, and a second cross circuit including a second transistor to connect the first and second output terminals. The differential amplifier circuit achieves an improvement in linearity, as compared to conventional differential amplifier circuits, by offsetting, at a load side, a non-linear component generated at an active element of the differential amplifier circuit, to output only a linear current component.

9 Claims, 9 Drawing Sheets

PRIOR ART

DIFFERENTIAL AMPLIFIER CIRCUIT AND FREQUENCY MIXER FOR IMPROVING LINEARITY

BACKGROUND OF THE INVENTION

1. Field of the Invention

The present invention relates to a differential amplifier circuit and a frequency mixer for improving linearity, and more particularly to a differential amplifier circuit and a frequency mixer which achieve an improvement in linearity by offsetting, at a load side, non-linear components generated at an active element of the differential amplifier circuit, to output only linear current components.

2. Description of the Related Art

A mobile wireless transmitter/receiver or the like uses, at a front end thereof, an amplifier and a frequency mixer, which exhibit high linearity, in order to avoid a degradation in receiver sensitivity caused by an intermodulation under a limited power consumption condition.

As a method for improving the linearity of such amplifier and frequency mixer, a feedback method, a pre-distortion method, etc. have been proposed. However, such methods have a practical problem in that the application thereof to a mobile terminal is difficult due to problems such as possibility of oscillation, complexity of implementation, and noise degradation.

In order to solve the above-mentioned problem, namely, to achieve an enhancement in linearity, various differential amplifier circuits have been proposed. FIG. 1 is a circuit diagram illustrating a configuration of a conventional differential amplifier circuit. As shown in the drawing, the conventional differential amplifier circuit includes two load resistors R1 and R2, two NMOS transistors T1 and T2, and a biasing current source $I_{Bias}$. The two load resistors R1 and R2 have the same resistance. The two NMOS transistors T1 and T2 are set to have the same channel characteristics. Two input signals $V_{in+}$ and $V_{in-}$ are applied to respective gates of the NMOS transistors T1 and T2. The differential amplifier circuit amplifies a difference between the input signals $V_{in+}$ and $V_{in-}$ and outputs the resultant signal.

With regard to a differential amplifier circuit for improving linearity, Korean Unexamined Patent Publication No. 10-2006-0011742 (DIFFERENTIAL AMPLIFIER CIRCUIT AND MIXER CIRCUIT INCLUDING THE SAME) discloses a differential amplifier circuit including an auxiliary differential amplifying stage 32, as shown in FIG. 2.

In the case of the Korean unexamined patent publication, a main differential amplifying stage 21 including a pair of NMOS transistors MN1 and MN2 constituting a differential pair and an auxiliary differential amplifying stage 32 including a pair of NMOS transistors MN3 and MN4 constituting another differential pair are connected in parallel, in order to make the secondary differential coefficient of the total transconductance affecting linearity have a negative value.

SUMMARY OF THE INVENTION

Therefore, the present invention has been made in view of the above problems, and it is an object of the present invention to provide a differential amplifier circuit which achieves an improvement in linearity, as compared to conventional differential amplifier circuits, by offsetting, at a load side, a non-linear component generated at an active element of the differential amplifier circuit, to output only a linear current component, through a circuit configuration different from the circuit configuration proposed in the above-mentioned Korean unexamined patent publication to achieve an improvement in linearity.

It is another object of the present invention to provide a frequency mixer which achieves an improvement in linearity in accordance with an application of the differential amplifier circuit to the frequency mixer.

In accordance with an aspect of the present invention, the above and other objects can be accomplished by the provision of a differential amplifier circuit for improving linearity, including: first and second loads; a first output terminal for the first load; a second output terminal for the second load; a differential amplifying stage including a differential stage for amplifying a voltage difference between a first input stage and a second input stage, and a biasing current source for biasing the differential stage; and a non-linearity filtering circuit for filtering a non-linear signal generated from the differential amplifying stage, the non-linearity filtering circuit including a first cross circuit including a first transistor to connect the first and second output terminals, and a second cross circuit including a second transistor to connect the first and second output terminals.

The first transistor may have a drain connected to the second output terminal, a gate connected to the first output terminal, and a source connected to a ground. The first cross circuit may further include a first bias voltage source stage for applying a first bias voltage to the gate of the first transistor. The second transistor may have a drain connected to the first output terminal, a gate connected to the second output terminal, and a source connected to the ground. The second cross circuit may further include a second bias voltage source stage for applying a second bias voltage to the gate of the second transistor.

The first bias voltage source stage may include a first capacitor connected between the gate of the first transistor and the first output terminal, and a first bias voltage source branched between the first capacitor and the gate of the first transistor. The second bias voltage source stage may include a second capacitor connected between the gate of the second transistor and the second output terminal, and a second bias voltage source branched between the second capacitor and the gate of the second transistor.

The differential stage may include a third transistor and a fourth transistor which constitute a differential pair.

The differential stage may further include a first cascode transistor cascode-connected to the third transistor, and a second cascode transistor cascode-connected to the fourth transistor. The first and second cascode transistors may constitute a differential pair.

The third cross circuit may further include a first cascode transistor connected to the first transistor. The second cross circuit may further include a fourth cascode transistor connected to the second transistor.

In accordance with another aspect of the present invention, there is provided a frequency mixer for improving linearity, including: first and second loads; a first output terminal for the first load; a second output terminal for the second load; a differential amplifying stage including a differential stage for amplifying a voltage difference between a first input stage and a second input stage, and a biasing current source for biasing the differential stage; a frequency mixing stage for modulating a frequency of an amplified signal output from the differential amplifying stage in accordance with a local oscillation signal, and outputting the resultant signal across the first and second output terminals; and a non-linearity filtering circuit for filtering a non-linear signal generated from the differential amplifying stage, the non-linearity filtering circuit including a first cross circuit including a first transistor to connect a first mixing stage input terminal and a second mixing stage input terminal, and a second cross circuit including a second transistor to connect the first and second mixing stage input terminals.

The first transistor may have a drain connected to the second mixing stage input terminal, a gate connected to the first mixing stage input terminal, and a source connected to the ground. The first cross circuit may further include a first bias voltage source stage for applying a first bias voltage to the gate of the first transistor. The second transistor may have a drain connected to the first mixing stage input terminal, a gate connected to the second mixing stage input terminal, and a source connected to the ground. The second cross circuit may further include a second bias voltage source stage for applying a second bias voltage to the gate of the second transistor.

The first bias voltage source stage may include a first capacitor connected between the gate of the first transistor and the first mixing stage input terminal, and a first bias voltage source branched between the first capacitor and the gate of the first transistor. The second bias voltage source stage may include a second capacitor connected between the gate of the second transistor and the second mixing stage input terminal, and a second bias voltage source branched between the second capacitor and the gate of the second transistor.

Through the above-described configurations, there are provided a differential amplifier circuit and a frequency mixer capable of achieving an improvement in linearity, as compared to conventional differential amplifier circuits used to improve linearity, by offsetting, at a load side, a non-linear component generated at an active element of the differential amplifier circuit, to output only a linear current component.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Hereinafter, embodiments of the present invention will be described in more detail with reference to the accompanying drawings.

Figure 1:
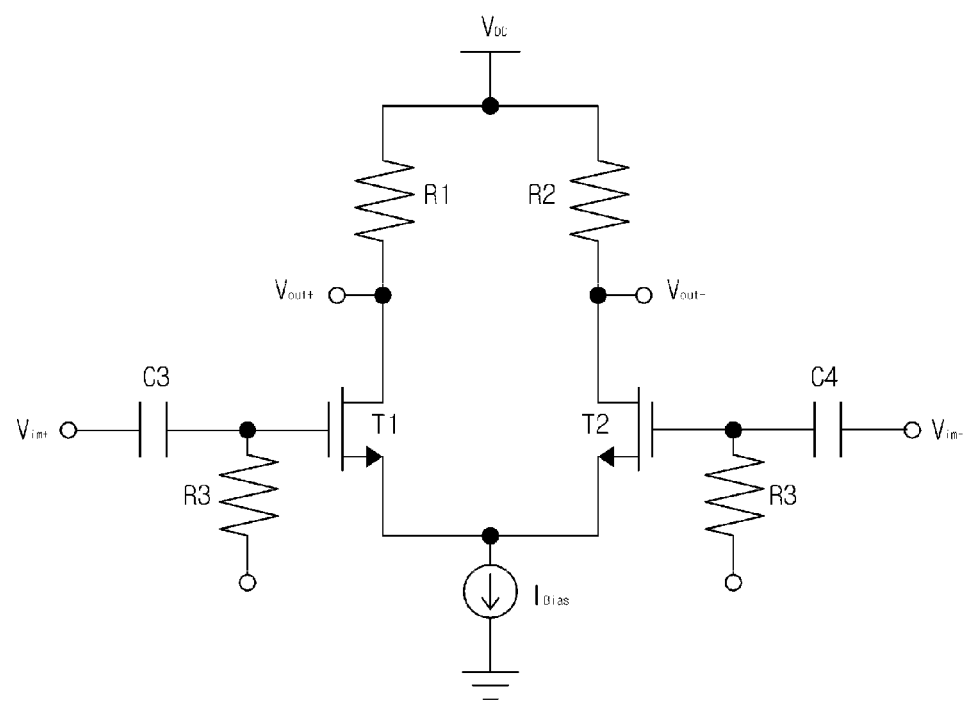
FIG. 1 is a circuit diagram illustrating a configuration of a general differential amplifier circuit.
Figure 2:
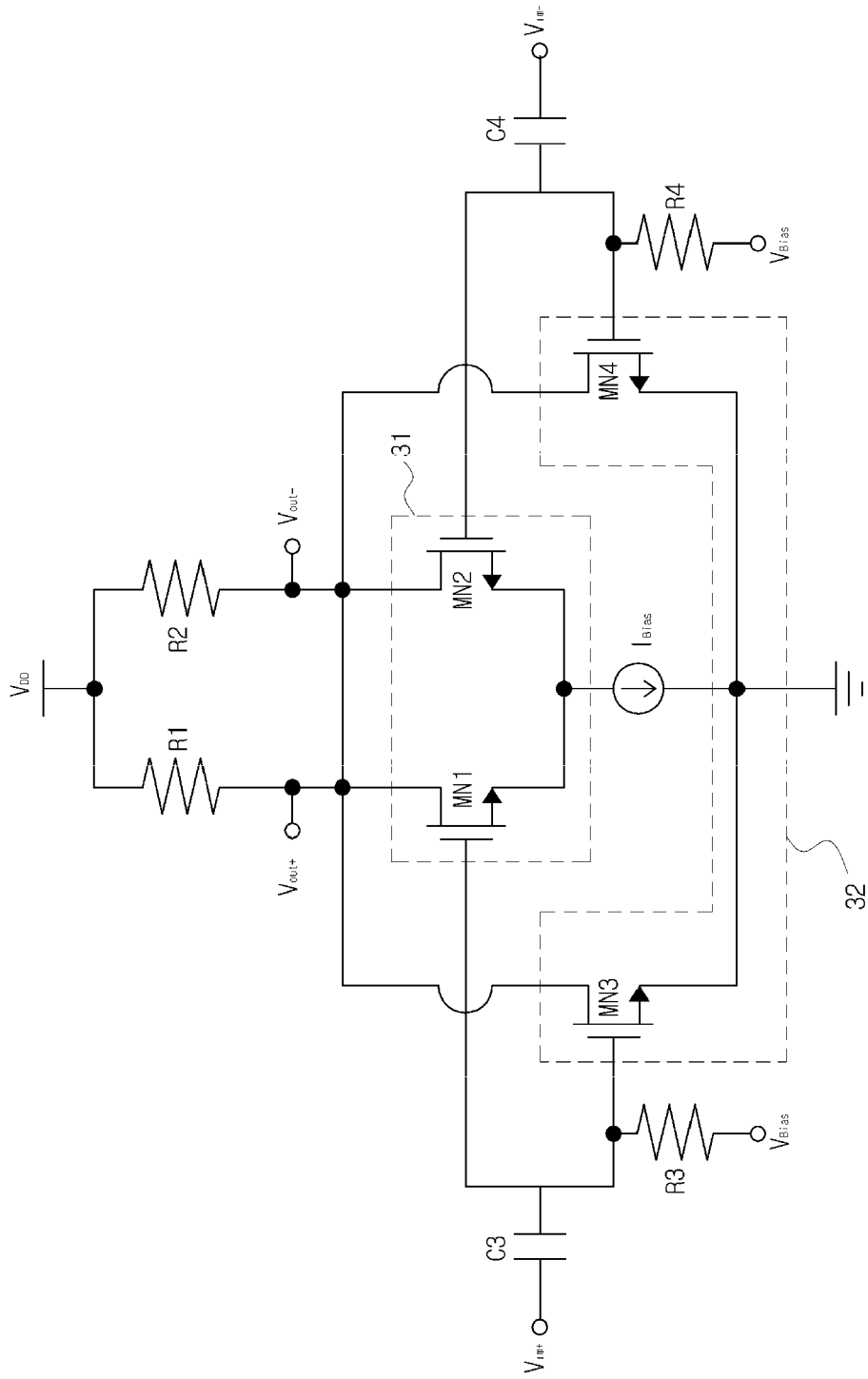
FIG. 2 is a circuit diagram illustrating a configuration of a conventional differential amplifier circuit for improving linearity.
Figure 3:
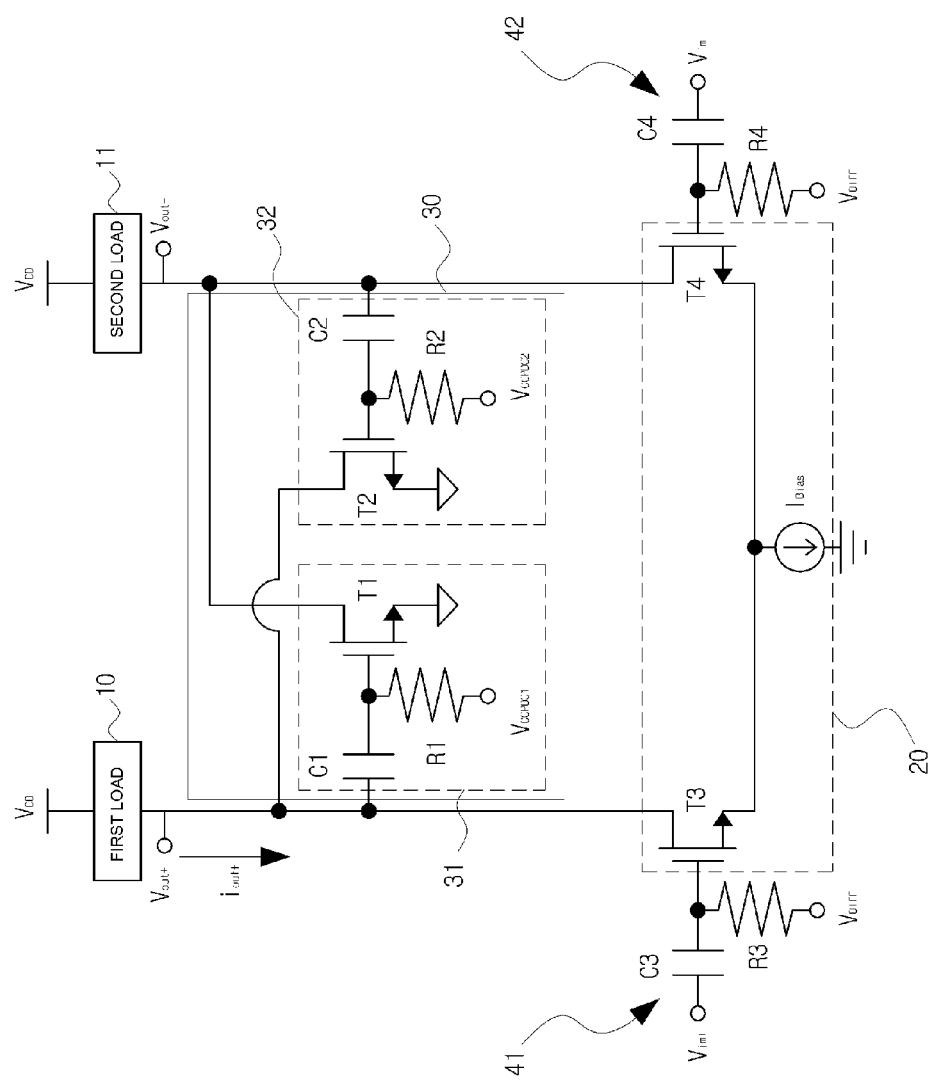
FIG. 3 is a circuit diagram illustrating a differential amplifier circuit according to a first embodiment of the present invention.

FIG. 3 is a circuit diagram illustrating a differential amplifier circuit according to a first embodiment of the present invention. As shown in the drawing, the differential amplifier circuit according to the first embodiment of the present invention includes a first load 10, a second load 11, a first output terminal $V_{out+}$, a second output terminal $V_{out-}$, a differential amplifying stage 20, and a non-linearity filtering circuit 30.

The differential amplifying stage 20 includes a differential stage for amplifying a voltage difference between a first input stage 41 and a second input stage 42, and a biasing current source $I_{Bias}$ for biasing the differential stage. The differential stage includes a pair of transistors T3 and T4 constituting a differential pair. In the following description, the transistors T3 and T4 constituting the differential pair will be referred to as a third transistor T3 and a fourth transistor T4, respectively. NMOS transistors are used as an example of the third and fourth transistors T3 and T4.

The third transistor T3 is connected to the first load 10 in series. The fourth transistor T4 is connected to the second load 11 in series. Thus, the third and fourth transistors T3 and T4 are connected to an internal supply voltage $V_{DD}$ via the first and second loads 10 and 11, respectively.

The third transistor T3 is connected, at a gate thereof, to the first input stage 41, to receive a first input voltage $V_{in+}$. The fourth transistor T4 is connected, at a gate thereof, to the second input stage 42, to receive a second input voltage $V_{in-}$. Accordingly, the differential stage outputs a voltage corresponding to a difference between the first and second input voltages $V_{in+}$ and $V_{in-}$.

A capacitor C3 and a resistor R3 are connected in parallel between the first input stage 41 and the third transistor T3. A capacitor C4 and a resistor R4 are connected in parallel between the second input stage 42 and the fourth transistor T4.

The biasing current source $I_{Bias}$ biases the differential stage. In order to make the differential stage operate in a differential mode, the biasing current source $I_{Bias}$ is connected between sources of the third and fourth transistors T3 and T4 while being connected to a reference potential.

The non-linearity filtering circuit 30 includes a first cross circuit 31 and a second cross circuit 32. The first cross circuit 31 includes a first transistor T1, whereas the second cross circuit 32 includes a second transistor T2. NMOS transistors are used as an example of the first and second transistors T1 and T2, as shown in FIG. 3.

In accordance with the first embodiment of the present invention, the first transistor T1 of the first cross circuit 31 connects the first and second output terminals $V_{out+}$ and $V_{out-}$. In detail, the first transistor T1 is connected, at a drain thereof, to the second output terminal $V_{out-}$. The first transistor T1 is also connected, at a gate thereof, to the first output terminal $V_{out+}$. The first transistor T1 is connected, at a source thereof, to the ground.

The first cross circuit 31 also includes a first bias voltage source stage to apply a bias voltage (hereinafter, referred to as a "first bias voltage") to the gate of the first transistor T1. In accordance with the first embodiment of the present invention, the first bias voltage source stage may include a first capacitor C1 connected between the gate of the first transistor T1 and the first output terminal $V_{out+}$, and a first bias voltage source $V_{CCPDC1}$ branched between the first capacitor C1 and the gate of the first transistor T1. A resistor R1 is connected to the first bias voltage source $V_{CCPDC1}$ in series. Through the above-described configuration, the first bias voltage is applied to the gate of the first transistor T1.

In accordance with the first embodiment of the present invention, the second transistor T2 of the second cross circuit 32 connects the first and second output terminals $V_{out+}$ and $V_{out-}$ similarly to the configuration of the first transistor T1. In detail, the second transistor T2 is connected, at a drain thereof, to the first output terminal $V_{out+}$. The second transistor T2 is also connected, at a gate thereof, to the second output terminal $V_{out-}$. The second transistor T2 is connected, at a source thereof, to the ground.

The second cross circuit 32 also includes a second bias voltage source stage to apply a bias voltage (hereinafter, referred to as a "second bias voltage") to the gate of the second transistor T2. In accordance with the first embodiment of the present invention, the second bias voltage source stage may include a second capacitor C2 connected between the gate of the second transistor T2 and the second output terminal $V_{out-}$, and a second bias voltage source $V_{CCPDC2}$ branched between the second capacitor C2 and the gate of the second transistor T2. A resistor R2 is connected to the second bias voltage source $V_{CCPDC2}$ in series. Through the above-described configuration, the second bias voltage is applied to the gate of the second transistor T2.

Hereinafter, operation of the differential amplifier circuit having the above-described configuration according to the first embodiment of the present invention will be described in detail.

Generally, drain current of a MOS transistor may be expressed with respect to a gate-source voltage, using power series, as follows:

$$i_d = g_1 v_{gs} + g_2 v_{gs}^2 + g_3 v_{gs}^3 + \quad \text{[Expression 1]}$$

where, "$i_d$" represents drain current, "$v_{gs}$" represents a gate-source voltage, "$g_i$" represents an I-th derivative of DC voltage transfer characteristics.

A non-linear intermodulation distortion signal is mainly generated due to a second derivative of transconductance, namely, a secondary differential coefficient $g_3$ of transconductance. In the differential amplifier circuit according to the first embodiment of the present invention, such a non-linear intermodulation distortion signal is offset to achieve an improvement in linearity. When Expression 1 is applied to the differential amplifier circuit according to the first embodiment of the present invention, the following Expression 2 may be established:

$$i_{d,A} = g_{1,A} v_{gs,A} + g_{2,A} v_{gs,A}^2 + g_{3,A} v_{gs,A}^3 + \ldots,$$

$$i_{d,B} = g_{1,B} v_{gs,B} + g_{2,B} v_{gs,B}^2 + g_{3,B} v_{gs,B}^3 + \ldots,$$

$$i_{d,C} = g_{1,C} v_{gs,C} + g_{2,C} v_{gs,C}^2 + g_{3,C} v_{gs,C}^3 + \ldots \quad \text{[Expression 2]}$$

where, "A" represents a discriminator for the third transistor T3, "B" represents a discriminator for the fourth transistor T4, and "C" represents a discriminator for the second transistor T2.

Since the third and fourth transistors T3 and T4 constitute a differential pair, the gate-source voltages of the first and second transistors T1 and T2 may be expressed by the following Expression 3:

$$v_{gs,A} = -v_{gs,B} = v_{in}/2 \quad \text{[Expression 3]}$$

where, "$v_{in}$" represents an input voltage.

When it is assumed that no mismatch occurs in the differential pair constituted by the third and fourth transistors T3 and T4, namely, a condition of "$g_{i,A} = g_{i,B}$" is established, the following Expression 4 may be derived from Expression 2:

$$i_{d,A} = g_{1,A}(v_{in}/2) + g_{2,A}(v_{in}/2)^2 + g_{3,A}(v_{in}/2)^3 \ldots,$$

$$i_{d,B} = -g_{1,A}(v_{in}/2) + g_{2,A}(v_{in}/2)^2 - g_{3,A}(v_{in}/2)^3 + \ldots,$$

$$i_{d,C} = g_{1,C} v_{gs,C} + g_{2,C} v_{gs,C}^2 + g_{3,C} v_{gs,C} + \ldots \quad \text{[Expression 4]}$$

When it is assumed that the load value of the differential amplifier circuit is Z, the gate-source voltage of the second transistor T2 may be expressed by the following Expression 5:

$$v_{gs,C} = -Z \cdot i_{d,B} \quad \text{[Expression 5]}$$

Using Expressions 4 and 5, drain current of the second transistor T2 may be expressed with respect to the input voltage $v_{in}$, as in the following Expression 6:

$$i_{d,C} = -g_{1,C} \cdot Z \cdot [-g_{1,A}(v_{in}/2) + \quad \text{[Expression 6]}$$
$$g_{2,A}(v_{in}/2)^2 - g_{3,A}(v_{in}/2)^3 + \ldots ] + g_{2,C} \cdot Z^2 \cdot$$
$$[-g_{1,A}(v_{in}/2) + g_{2,A}(v_{in}/2)^2 - g_{3,A}(v_{in}/2)^3 + \ldots ]^2 -$$
$$g_{3,C} \cdot Z^3 \cdot$$
$$[-g_{1,A}(v_{in}/2) + g_{2,A}(v_{in}/2)^2 - g_{3,A}(v_{in}/2)^3 + \ldots ]^3$$

When third and higher items in Expression 6 are ignored, the following Expression 7 may be established:

$$i_{d,C} = -g_{1,C} \cdot g_{1,A} \cdot Z \cdot (v_{in}/2) + \quad \text{[Expression 7]}$$
$$(g_{2,C} \cdot g_{1,A}^2 \cdot Z^2 - g_{1,C} \cdot g_{2,A} \cdot Z)(v_{in}/2)^2 +$$
$$(g_{1,C} \cdot g_{3,A} \cdot Z - 2 \cdot g_{2,C} \cdot g_{1,A} \cdot g_{2,A} \cdot Z^2 + g_{3,C} \cdot g_{1,A}^3 \cdot Z^3)$$
$$(v_{in}/2)^3$$

Since output current $i_{out+}$ corresponds to the sum of the drain current of the second transistor T2 and the drain current of the third transistor T3 in accordance with the Kirchhoff's Current Law (KCL), it may be expressed by the following Expression 8:

$$i_{out+} = (g_{1,A} + g_{1,C} \cdot g_{1,A} \cdot Z)(v_{in}/2) + \quad \text{[Expression 8]}$$
$$\left( \frac{g_{2,A} + g_{2,C} \cdot g_{1,A}^2 \cdot Z^2 -}{g_{1,C} \cdot g_{2,A} \cdot Z} \right)(v_{in}/2)^2 +$$
$$\left( \begin{array}{c} g_{3,A} + g_{1,C} \cdot g_{3,A} \cdot Z - \\ 2 \cdot g_{2,C} \cdot g_{1,A} \cdot g_{2,A} \cdot Z^2 + \\ g_{3,C} \cdot g_{1,A}^3 \cdot Z^3 \end{array} \right)(v_{in}/2)^3$$
$$= g_{1,out}(v_{in}/2) + g_{2,out}(v_{in}/2)^2 +$$
$$g_{3,out}(v_{in}/2)^3$$

The third item of Expression 8 may be expressed in more detail, as in the following Expressions 9 and 10:

$$g_{3,out} = g_{3,A} + g_{1,C} \cdot g_{3,A} \cdot Z - \quad \text{[Expression 9]}$$
$$2 \cdot g_{2,C} \cdot g_{1,A} \cdot g_{2,A} \cdot Z^2 + g_{3,C} \cdot g_{1,A}^3 \cdot Z^3$$
$$= g_{3,out1} + g_{3,out2} + g_{3,out3} + g_{3,out4}$$

$$g_{3,out1} = g_{3,A} \quad \text{[Expression 10]}$$
$$g_{3,out2} = g_{1,C} \cdot g_{3,A} \cdot Z$$
$$g_{3,out3} = -2 \cdot g_{2,C} \cdot g_{1,A} \cdot g_{2,A} \cdot Z^2$$
$$g_{3,out4} = g_{3,C} \cdot g_{1,A}^3 \cdot Z^3$$

In order to make the differential amplifier circuit have sufficient gain and noise characteristics, bias voltages $V_{DIFF}$ respectively applied to the third and fourth transistors T3 and T4 in the case of FIG. 3 operate in a strong-inversion region where "$g_3$" has a negative sign. In this case, "$g_{3,out1}$", "$g_{3,out2}$", and "$g_{3,out3}$" in Expressions 9 and 10 have a negative sign.

In the second cross circuit 32 of the differential amplifier circuit according to the present invention, therefore, it may be possible to offset the non-linear current of the third transistor T3 transferred as an output by making the second bias voltage applied to the second transistor T2 operate in a weak-inversion region where "$g_{3,out4}$" has a positive sign. That is, in the differential amplifier circuit according to the present invention, the second transistor T2 is provided to operate in a weak-inversion region where the first bias voltage makes the secondary differential coefficient of the transconductance of the first cross circuit 31 have a positive value. The second bias voltage may be adjusted through a control of the second bias voltage source $V_{CCPDC}$.

Heretofore, the principle of offsetting the non-linear current of the third transistor T3 has been described. The principle of offsetting the non-linear current of the fourth transistor T4 may be understood by applying the above-described principle to the relation between the third transistor T3 and the first cross circuit 31, so no description thereof will be given.

Figure 4A:
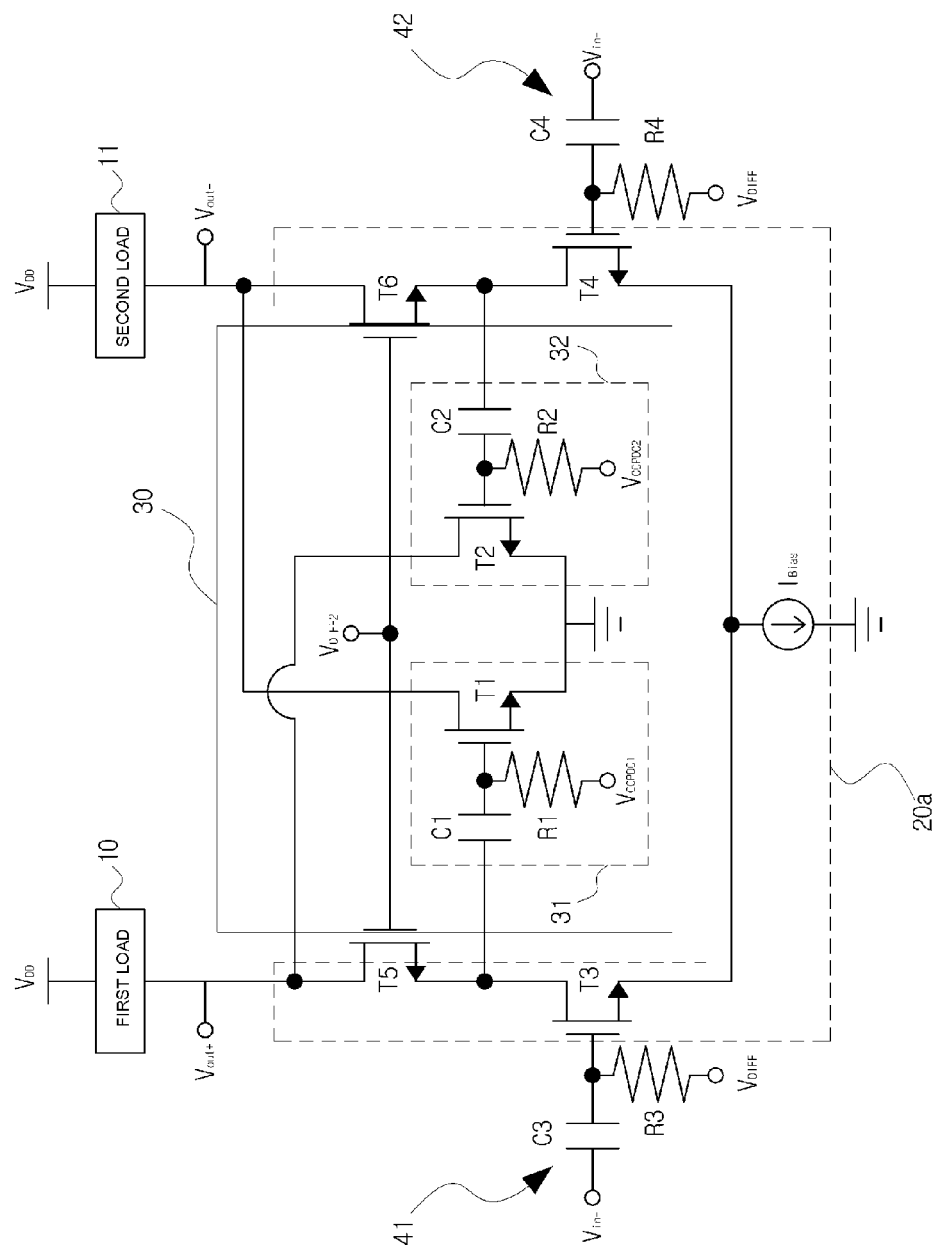
FIGS. 4A and 4B are circuit diagrams illustrating configurations of a differential amplifier circuit according to a second embodiment of the present invention, respectively.

FIG. 4A is a circuit diagram illustrating a configuration of a differential amplifier circuit according to a second embodiment of the present invention. The differential amplifier circuit according to the second embodiment of the present invention is a modification of the differential amplifier circuit according to the first embodiment as described above. In the following description associated with the second embodiment of the present invention, constituent elements corresponding to those of the first embodiment will be designated by the same reference numerals as those of the first embodiment, and no description thereof will be given.

Referring to FIG. 4A, the differential amplifier circuit according to the second embodiment of the present invention includes a differential amplifying stage 20a including a differential stage and a biasing current source $I_{Bias}$.

In accordance with the second embodiment of the present invention, the differential stage of the differential amplifying stage 20a includes a third transistor T3 and a third cascode transistor T5, which are cascode-connected to each other, and a fourth transistor T4 and a fourth cascode transistor T6, which are cascode-connected to each other. The cascode-connected third transistor T3 and third cascode transistor T5 and the cascode-connected fourth transistor T4 and fourth cascode transistor T6 constitute respective differential pairs. A bias voltage $V_{DIFF2}$ is applied to the gates of the third and fourth cascode transistors T5 and T6.

In accordance with the cascode connection between the third and fourth transistors T3 and T4 and the third and fourth cascode transistors T5 and T6, which constitute the differential stage, the Miler capacitance between the gate and drain of each transistor is reduced. Accordingly, the frequency characteristics of the differential amplifier circuit are improved. The output resistance at the drain of each transistor is reduced. As a result, it is possible to increase the gain obtained when a load is connected to the drain of each transistor.

Figure 4B:
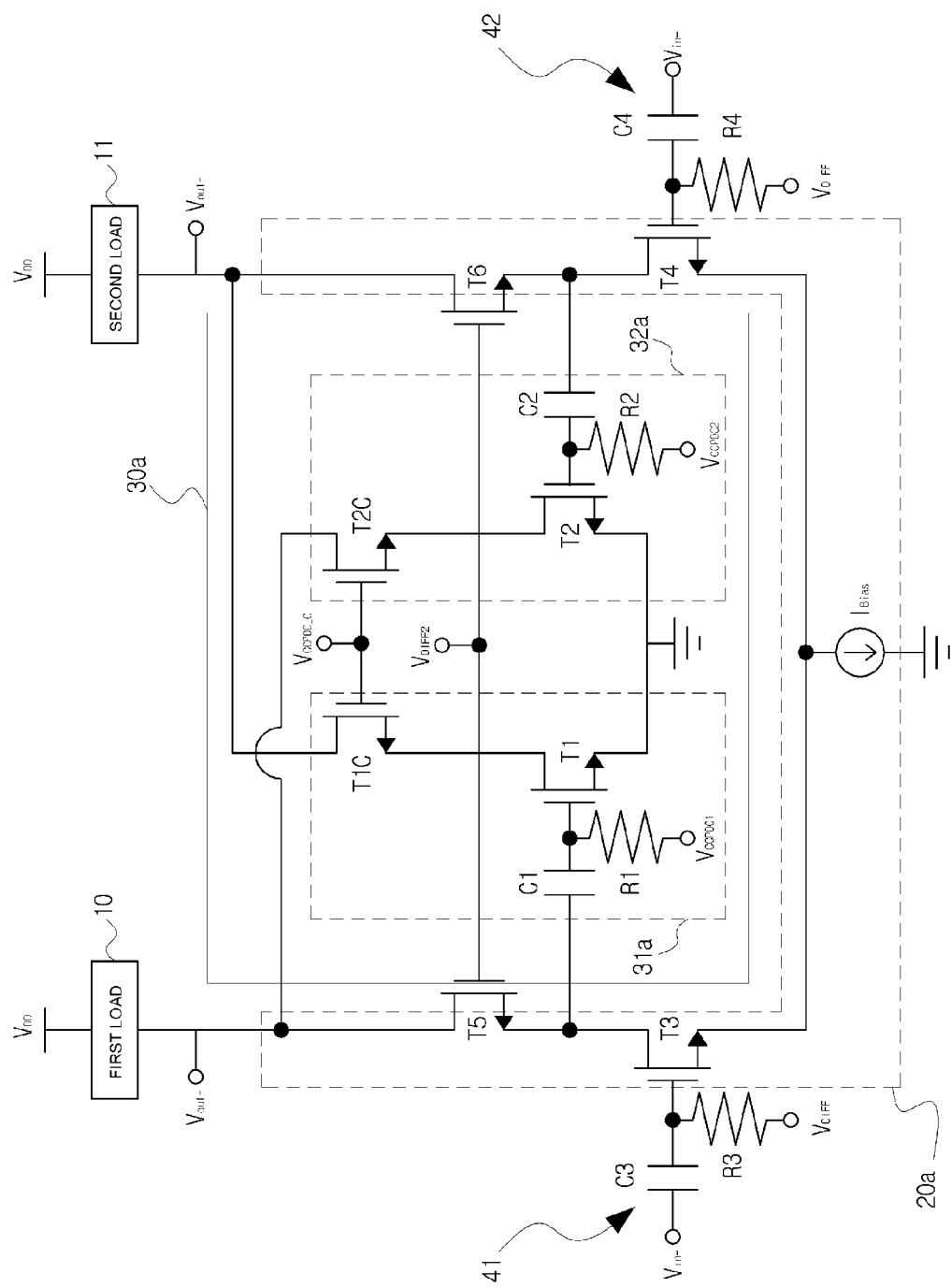

FIG. 4B is a circuit diagram illustrating a modification of the differential amplifier circuit according to the second embodiment of the present invention. As shown in the drawing, in the modification of the differential amplifier circuit according to the second embodiment of the present invention, cascode transistors are connected to first and second transistors, which constitute a non-linear filtering circuit 30a.

That is, the non-linear filtering circuit 30a includes a first cross circuit 31a and a second cross circuit 32a, as shown in FIG. 4B. The first cross circuit 31a includes a first transistor T1 and a first cascode transistor T1C cascode-connected to the first transistor T1. The second cross circuit 32a includes a second transistor T2 and a second cascode transistor T2C cascode-connected to the second transistor T2. A bias voltage source $V_{CCPDC\_C}$ is connected to the gates of the first and second cascode transistors T1C and T2C, to apply a bias voltage to the first and second cascode transistors T1C and T2C.

Figure 5:
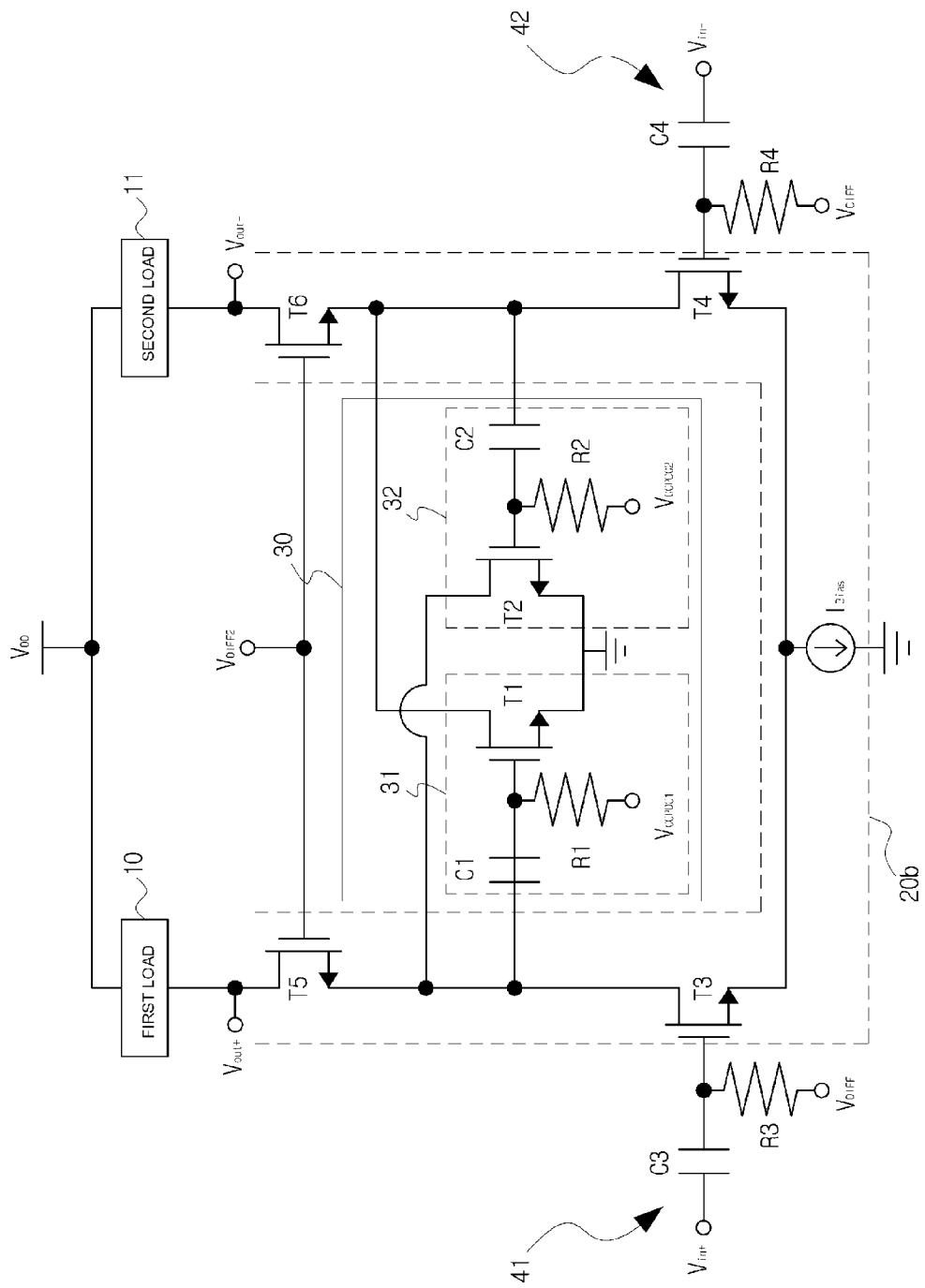
FIG. 5 is a circuit diagram illustrating a configuration of a differential amplifier circuit according to a third embodiment of the present invention.

FIG. 5 is a circuit diagram illustrating a configuration of a differential amplifier circuit according to a third embodiment of the present invention. The differential amplifier circuit according to the third embodiment of the present invention is a modification of the differential amplifier circuit according to the first embodiment as described above. In the following description associated with the third embodiment of the present invention, constituent elements corresponding to those of the first embodiment will be designated by the same reference numerals as those of the first embodiment, and no description thereof will be given.

Referring to FIG. 5, the differential amplifier circuit according to the third embodiment of the present invention includes a differential amplifying stage 20b including a differential stage and a biasing current source $I_{Bias}$.

In accordance with the third embodiment of the present invention, the differential stage of the differential amplifying stage 20b includes a third transistor T3 and a third cascode transistor T5, which are cascode-connected to each other, and a fourth transistor T4 and a fourth cascode transistor T6, which are cascode-connected to each other. The cascode-connected third transistor T3 and third cascode transistor T5 and the cascode-connected fourth transistor T4 and fourth cascode transistor T6 constitute respective differential pairs. A bias voltage $V_{DIFF2}$ is applied to the gates of the third and fourth cascode transistors T5 and T6.

In the differential amplifying stage 20b according to the third embodiment of the present invention, the third and fourth cascode transistors T5 and T6 are arranged between the first cross circuit 31 and the first output terminal $V_{out+}$ and between the second cross circuit 32 and the second output terminal $V_{out-}$, respectively, as shown in FIG. 5, different from the differential amplifying stage 20a according to the second embodiment.

In accordance with the cascode connection between the third and fourth transistors T3 and T4 and the third and fourth cascode transistors T5 and T6, which constitute the differential stage, the Miler capacitance between the gate and drain of each transistor is reduced. Accordingly, the frequency characteristics of the differential amplifier circuit are improved. The output resistance at the drain of each transistor is reduced. As a result, it is possible to increase the gain obtained when a load is connected to the drain of each transistor.

Figure 6:
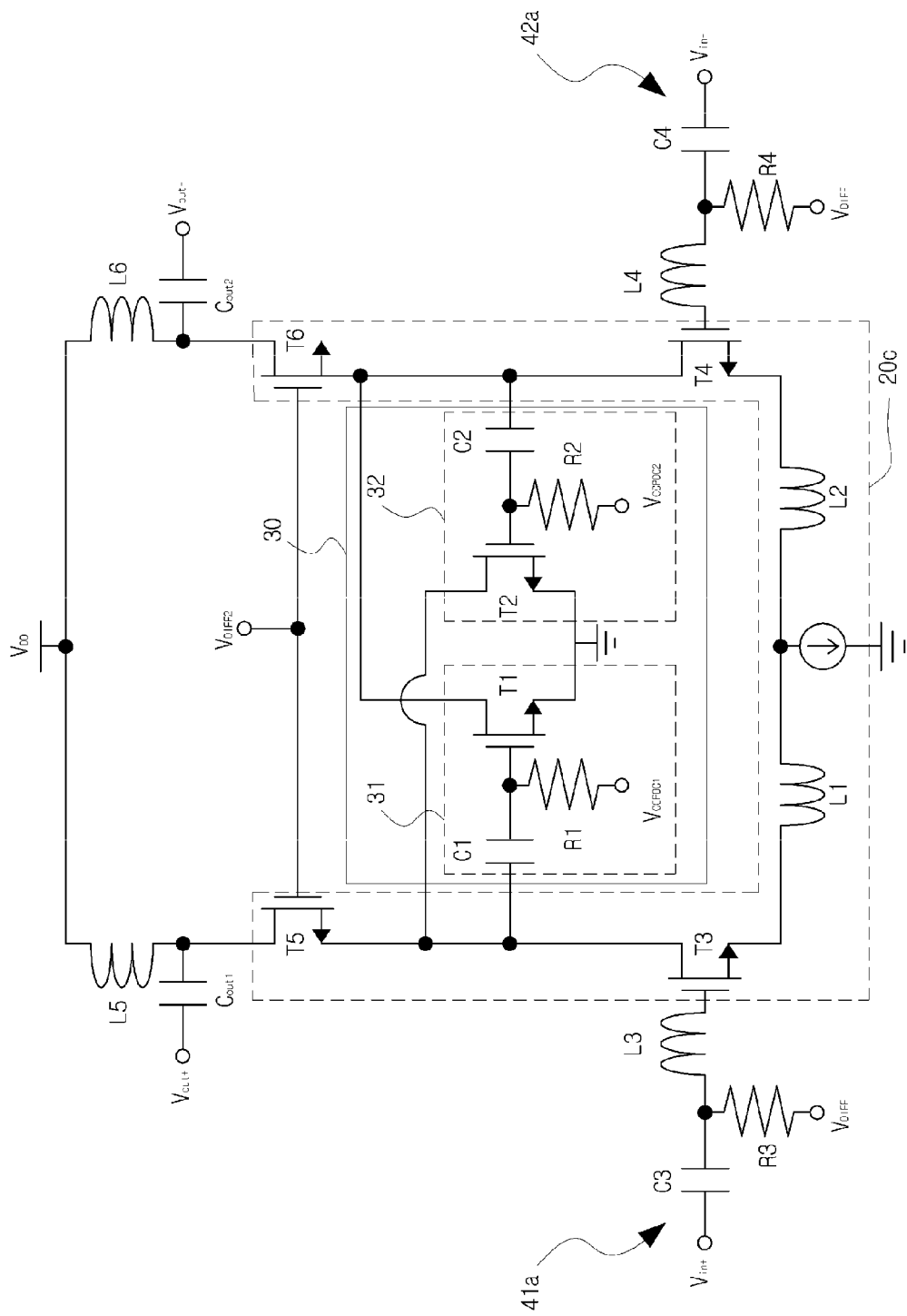
FIG. 6 is a circuit diagram illustrating a configuration of a differential amplifier circuit according to a fourth embodiment of the present invention.

FIG. 6 is a circuit diagram illustrating a configuration of a differential amplifier circuit according to a fourth embodiment of the present invention. The differential amplifier circuit according to the fourth embodiment of the present invention is a modification of the differential amplifier circuit according to the third embodiment as described above. In the following description associated with the fourth embodiment of the present invention, constituent elements corresponding to those of the third embodiment will be designated by the same reference numerals as those of the third embodiment, and no description thereof will be given.

The differential amplifier circuit according to the fourth embodiment of the present invention implements a low-noise differential amplifier circuit. Referring to FIG. 6, the differential amplifier circuit according to the fourth embodiment of the present invention includes a first load L5, a second load L6, a first output terminal $V_{out+}$, a second output terminal $V_{out-}$ a differential amplifying stage 20c, and a non-linearity filtering circuit 30. In the fourth embodiment of the present invention, each of the first and second loads L5 and L6 has the form of an inductor.

The differential amplifying stage 20c includes a differential stage for amplifying a voltage difference between a first input stage 41a and a second input stage 42a, and a biasing current source $I_{Bias}$ for biasing the differential stage. The differential stage includes transistors T3 and T4 constituting a differential pair. NMOS transistors are used as an example of the third and fourth transistors T3 and T4.

The differential stage also includes a third cascode transistor T5 cascode-connected to the third transistor T3, and a fourth cascode transistor T6 cascode-connected to the fourth transistor T4. The cascode-connected third transistor T3 and third cascode transistor T5 and the cascode-connected fourth transistor T4 and fourth cascode transistor T6 constitute differential pairs, respectively. A bias voltage $V_{DIFF2}$ is applied to the gates of the third and fourth cascode transistors T5 and T6.

The third transistor T3 is connected to the first load L5 in series. The fourth transistor T4 is connected to the second load L6 in series. Thus, the third and fourth transistors T3 and T4 are connected to an internal supply voltage $V_{DD}$ via the first and second loads L5 and L6, respectively.

The third transistor T3 is connected, at a gate thereof, to the first input stage 41b, to receive a first input voltage $V_{in+}$. The fourth transistor T4 is connected, at a gate thereof, to the second input stage 42b, to receive a second input voltage $V_{in-}$. Accordingly, the differential stage outputs a voltage corresponding to a difference between the first and second input voltages $V_{in+}$ and $V_{in-}$.

A capacitor C3 and a resistor R3 are connected in parallel between the first input stage 41b and the third transistor T3. A capacitor C4 and a resistor R4 are connected in parallel between the second input stage 42b and the fourth transistor T4. Inductors L3 and L4 are connected to respective gates of the third and fourth transistors T3 and T4.

The biasing current source $I_{Bias}$ biases the differential stage. In order to make the differential stage operate in a differential mode, the biasing current source $I_{Bias}$ is connected between sources of the third and fourth transistors T3 and T4 while being connected to a reference potential.

In the differential amplifying stage 20c of the differential amplifier circuit according to the fourth embodiment of the present invention, inductors L1 and L2 are connected between the source of the third transistor T3 and the biasing current source $I_{Bias}$ and between the source of the fourth transistor T4 and the biasing current source $I_{Bias}$, respectively.

Capacitors $C_{out1}$ and $C_{out2}$ are installed at the first and second output terminals $V_{out+}$ and $V_{out-}$, respectively.

Figure 7:
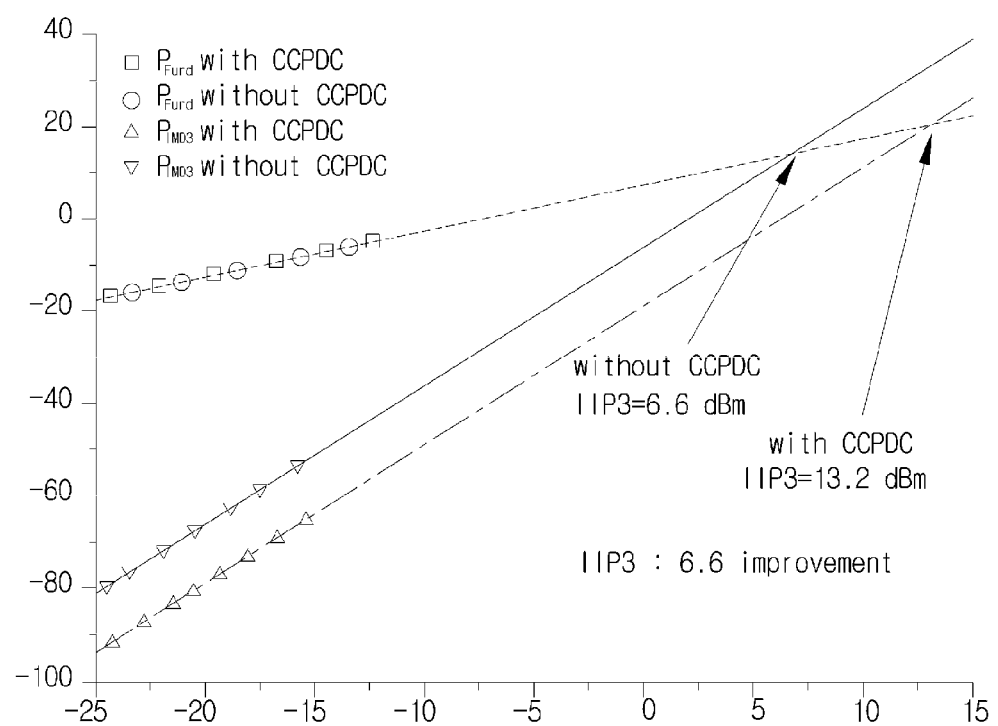
FIG. 7 is a graph depicting an improvement in third-order input intercept point (IIP3) achieved by the differential amplifier circuit according to the fourth embodiment of the present invention.

FIG. 7 is a graph depicting an improvement in third-order input intercept point (IIP3) achieved by the differential amplifier circuit according to the fourth embodiment of the present invention. Referring to FIG. 7, it can be seen that the case, in which the bias voltage $V_{CCPDC}$ is used in the differential amplifier circuit according to the fourth embodiment of the present invention, exhibits an improvement in IIP3 by 6.6 dBm, as compared to the case, in which the bias voltage $V_{CCPDC}$ is not used.

The cascode connection has been described in conjunction with the example of FIG. 4B illustrating a modification of the differential amplifier circuit according to the second embodiment shown in FIG. 4A, in which the non-linear filtering circuit 30a includes the cascode transistors T1C and T2C respectively cascode-connected to the first and second transistors T1 and T2. However, such a cascode connection may also be applied to the non-linear filtering circuits of the first, third, and fourth embodiments.

Figure 8:
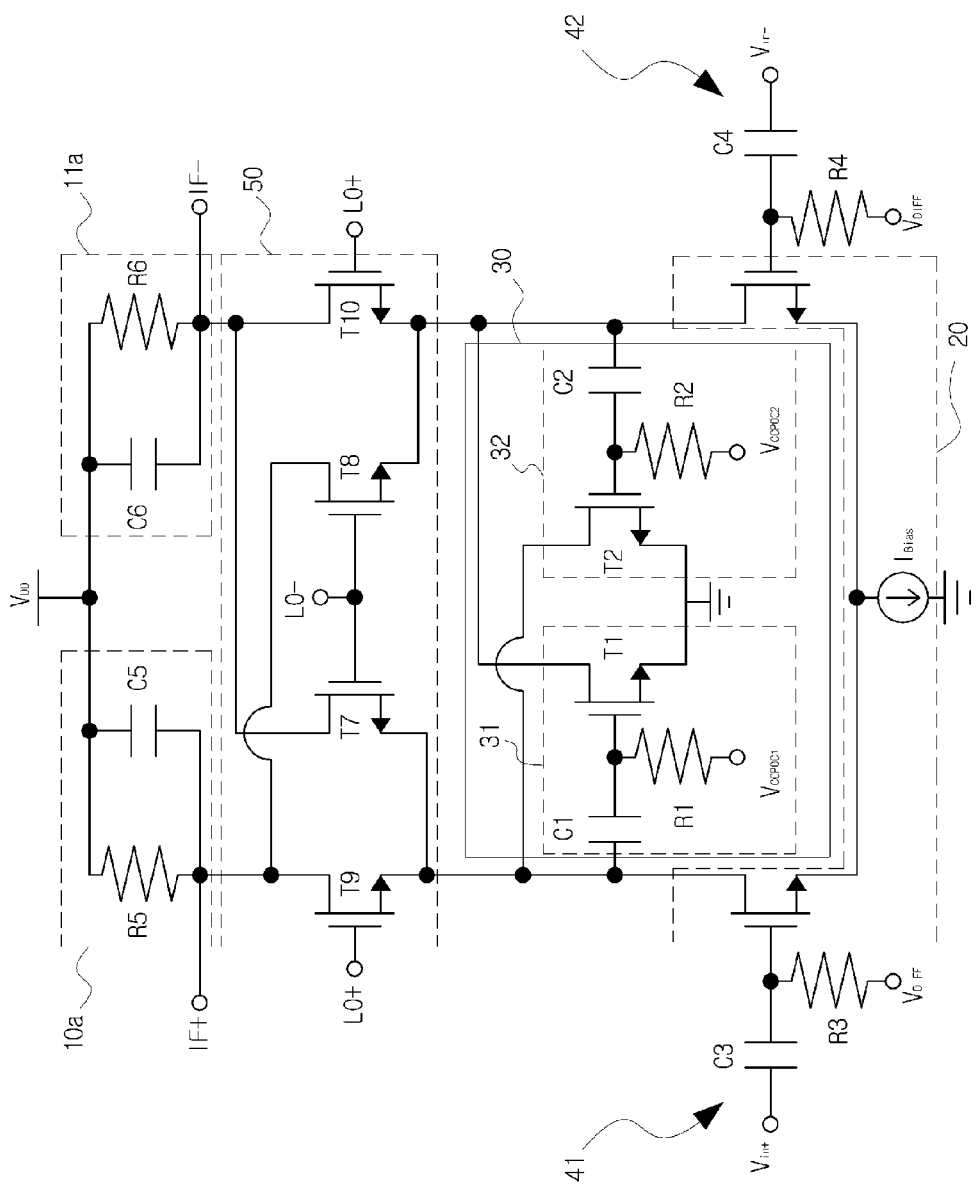
FIG. 8 is a circuit diagram illustrating a configuration of a frequency mixer according to the present invention.

FIG. 8 is a circuit diagram illustrating a configuration of a frequency mixer according to the present invention. In an example illustrated in FIG. 8, the basic configuration of the differential amplifier circuit according to the first embodiment of the present invention is applied to the frequency mixer according to the present invention.

Referring to FIG. 8, the frequency mixer according to the present invention includes a first load 10a, a second load 11a, a first output terminal IF+, a second output terminal IF−, a differential amplifying stage 20, a non-linearity filtering circuit 30, and a frequency mixing stage 50.

The first load 10a includes a capacitor C5 and a resistor R5 which are connected in parallel. The second load 11a includes a capacitor C6 and a resistor R6 which are connected in parallel.

The frequency mixing stage 50 has a double-balanced structure. That is, as shown in FIG. 8, the frequency mixing stage 50 includes one differential pair constituted by a fifth transistor T7 and a sixth transistor T9, and another differential pair constituted by a seventh transistor T8 and an eighth transistor T10. A local oscillation signal LO+ is input to gates of the sixth and eighth transistors T9 and T10, whereas a local oscillation signal LO− is input to gates of the fifth and seventh transistors T7 and T8. Sources of the fifth and sixth transistors T7 and T9 are coupled to each other such that they are connected in common to the differential amplifying stage 20. Also, sources of the seventh and eighth transistors T8 and T10 are coupled to each other such that they are connected in common to the differential amplifying stage 20.

The frequency mixing stage 50 mixes radio frequency (RF) signals RF+ and RF− amplified by the differential amplifying stage 20 with the local oscillation signal LO+ and LO−, respectively, to modulate the frequencies of the RF signals RF+ and RF−. Thus, the frequency mixing stage 50 outputs intermediate frequency signals IF+ and IF− to the first and second output terminals IF+ and IF−, respectively.

The differential amplifying stage 20 includes a differential stage for amplifying two input signals (phase-shifted signals) RF+ and RF− respectively input to first and second input stages 41 and 42, and a biasing current source $I_{Bias}$ for biasing the differential stage. The differential stage includes third and fourth transistors T3 and T4 constituting a differential pair. NMOS transistors are used as an example of the third and fourth transistors T3 and T4.

The third transistor T3 is connected to the first load 10a in series. The fourth transistor T4 is connected to the second load 11a in series. Thus, the third and fourth transistors T3 and T4 are connected to an internal supply voltage $V_{DD}$ via the first and second loads 10a and 11a, respectively.

The third transistor T3 is connected, at a gate thereof, to the first input stage 41. The fourth transistor T4 is connected, at a gate thereof, to the second input stage 42. Accordingly, the third and fourth transistors T3 and T4 receive input signals, namely, the RF signals RF+ and RF−, through the gates thereof, respectively.

A capacitor C3 and a resistor R3 are connected in parallel between the first input stage 41 and the third transistor T3. A capacitor C4 and a resistor R4 are connected in parallel between the second input stage 42 and the fourth transistor T4.

The biasing current source $I_{Bias}$ biases the differential stage. In order to make the differential stage operate in a differential mode, the biasing current source $I_{Bias}$ is connected between sources of the third and fourth transistors T3 and T4 while being connected to a reference potential.

Meanwhile, the configuration and operation of the non-linearity filtering circuit 30 correspond to those of the differential amplifier circuit according to the first embodiment as described above, so no detailed description thereof will be given. Of course, the non-linearity filtering circuit 30 connects opposite input terminals of the frequency mixing stage 50, namely, first and second mixing stage input terminals.

Through the above-described configuration, the frequency mixer according to the present invention can achieve an enhancement in linearity without a variation in gain.

The frequency mixer according to the present invention has been described in conjunction with the example in which the non-linearity filtering circuit 30 according to the first embodiment of the present invention is applied to a double-balanced frequency mixer. However, the non-linearity filtering circuit 30 may also be applied to frequency mixers of other types such as a folded frequency mixer and an LC-folded frequency mixer. For the non-linearity filtering circuit applied to the frequency mixer, the non-linearity filtering circuit according to any one of the first to fourth embodiments may also be used.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A differential amplifier circuit for improving linearity, comprising:
   first and second loads;
   a first output terminal for the first load;
   a second output terminal for the second load;
   a differential amplifying stage comprising a differential stage for amplifying a voltage difference between a first input stage and a second input stage, and a biasing current source for biasing the differential stage; and
   a non-linearity filtering circuit for filtering a nonlinear signal generated from the differential amplifying stage, the non-linearity filtering circuit comprising a first cross circuit including a first transistor to connect the first and second output terminals, and a second cross circuit including a second transistor to connect the first and second output terminals,
   wherein the first transistor has a drain connected to the second output terminal, a gate connected to the first output terminal, and a source connected to a ground;
   the first cross circuit further includes a first bias voltage source stage for applying a first bias voltage to the gate of the first transistor;
   the second transistor has a drain connected to the first output terminal, a gate connected to the second output terminal, and a source connected 5 to the ground; and
   the second cross circuit further includes a second bias voltage source stage for applying a second bias voltage to the gate of the second transistor.

2. The differential amplifier circuit according to claim 1, wherein:
   the first bias voltage source stage includes a first capacitor connected between the gate of the first transistor and the first output terminal, and a first bias voltage source branched between the first capacitor and the gate of the first transistor; and
   the second bias voltage source stage includes a second capacitor connected between the gate of the second transistor and the second output terminal, and a second bias voltage source branched between the second capacitor and the gate of the second transistor.

3. The differential amplifier circuit according to claim 1, wherein the differential stage includes a third transistor and a fourth transistor which constitute a differential pair.

4. The differential amplifier circuit according to claim 3, wherein: the differential stage further includes a first cascode transistor cascade-connected to the third transistor, and a second cascode transistor cascade-connected to the fourth transistor; and the first and second cascode transistors constitute a differential pair.

5. The differential amplifier circuit according to claim 4, wherein: the first cross circuit further includes a third cascode transistor connected to the first transistor; and the second cross circuit further includes a fourth cascode transistor connected to the second transistor.

6. The differential amplifier circuit according to claim 2, wherein the differential stage includes a third transistor and a fourth transistor which constitute a differential pair.

7. A frequency mixer for improving linearity, comprising:
   first and second loads;
   a first output terminal for the first load;
   a second output terminal for the second load;
   a differential amplifying stage comprising a differential stage for amplifying a voltage difference between a first input stage and a second input stage, and a biasing current source for biasing the differential stage;
   a frequency mixing stage for modulating a frequency of an amplified signal output from the differential amplifying stage in accordance with a local oscillation signal, and outputting the resultant signal across the first and second output terminals; and
   a non-linearity filtering circuit for filtering a non-linear signal generated from the differential amplifying stage, the non-linearity filtering circuit comprising a first cross circuit including a first transistor to connect a first mixing stage input terminal and a second mixing stage input terminal, and a second cross circuit including a second transistor to connect the first and second mixing stage input terminals.

8. The frequency mixer according to claim 7, wherein:
   the first transistor has a drain connected to the second mixing stage input terminal, a gate connected to the first mixing stage input terminal, and a source connected to a ground;

the first cross circuit further includes a first bias voltage source stage for applying a first bias voltage to the gate of the first transistor;

the second transistor has a drain connected to the first mixing stage input terminal, a gate connected to the second mixing stage input terminal, and a source connected to the ground; and the second cross circuit further includes a second bias voltage source stage for applying a second bias voltage to the gate of the second transistor.

9. The frequency mixer according to claim 8, wherein:

the first bias voltage source stage includes a first capacitor connected between the gate of the first transistor and the first mixing stage input terminal, and a first bias voltage source branched between the first capacitor and the gate of the first transistor; and the second bias voltage source stage includes a second capacitor connected between the gate of the second transistor and the second mixing stage input terminal, and a second bias voltage source branched between the second capacitor and the gate of the second transistor.

* * * * *